United States Patent [19]

Kumada

[11] Patent Number: 4,945,634
[45] Date of Patent: Aug. 7, 1990

[54] ASSEMBLY PACKAGING METHOD FOR SENSOR ELEMENTS

[75] Inventor: Akira Kumada, Kanagawa, Japan

[73] Assignee: Murata Mfg. Co., Ltd., Kyoto, Japan

[21] Appl. No.: 400,568

[22] Filed: Aug. 29, 1989

[30] Foreign Application Priority Data

Aug. 31, 1988 [JP] Japan ................... 63-218926

[51] Int. Cl.⁵ .................. H05K 13/04; H01R 43/00
[52] U.S. Cl. ............................... 29/854; 437/209
[58] Field of Search ............. 29/842, 843, 854, 827; 437/209, 182

[56] References Cited

U.S. PATENT DOCUMENTS 4,038,744 8/1977 Cheype et al. ................. 29/827
4,835,847 6/1989 Kamperman ................... 29/827

FOREIGN PATENT DOCUMENTS 124070 10/1978 Japan ........................... 437/209
9329 1/1983 Japan ........................... 437/209

Primary Examiner—P. W. Echols
Attorney, Agent, or Firm—Koda & Androlia

[57] ABSTRACT

A method of mounting electrodes on a sensor chip and coating the sensor chip for insulation. Small through holes corresponding to the connecting terminals of a sensor chip for connecting the sensor chip to external elements and electrode patterns serving as lead frames are continuously provided for respective sensors in the longitudinal direction on a sheet-like tape carrier composed of a protective insulation material. The sensor chips are mounted on the tape carrier and the terminals of the sensor chips are connected to the corresponding electrode patterns through the corresponding small through holes, thereby completing the assembly packaging a sensor of a plurality of sensor elements. The thus-obtained sensor elements arranged in alignment and in parallel on the tape carrier are separated from each other and mounted on respective sensor bases and packaged.

6 Claims, 4 Drawing Sheets

FIG. IA
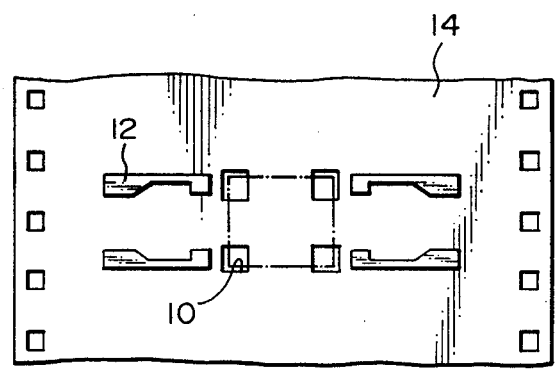
FIG. IB
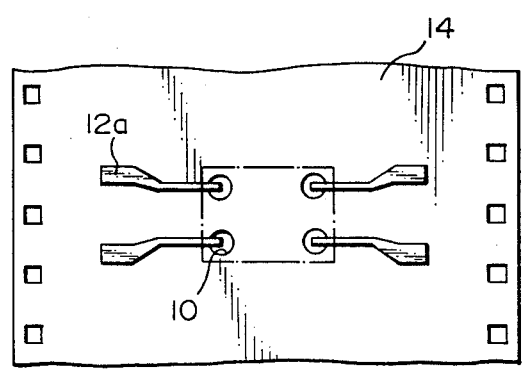

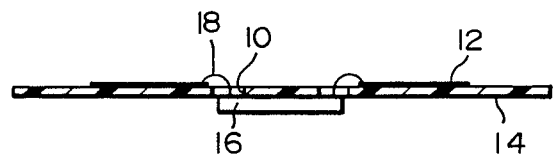
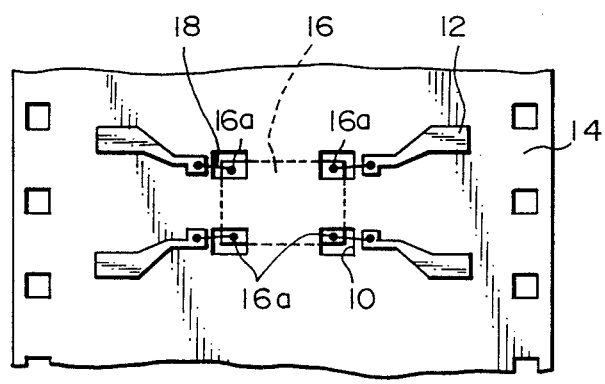

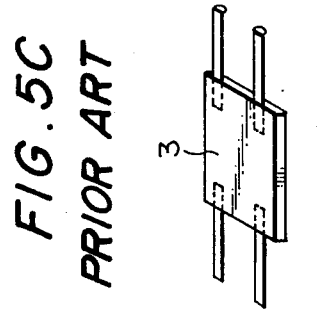
FIG. 5A PRIOR ART
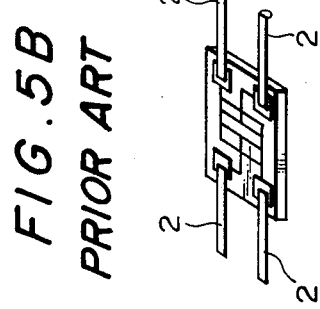
FIG. 5B PRIOR ART
FIG. 5C PRIOR ART
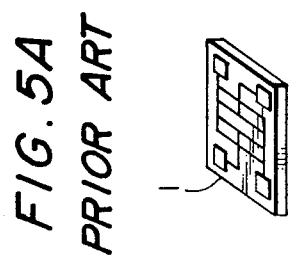
FIG. 6 PRIOR ART
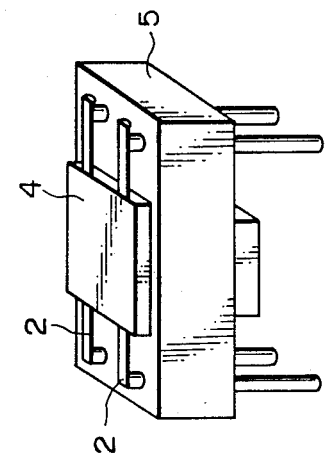

ASSEMBLY PACKAGING METHOD FOR SENSOR ELEMENTS

BACKGROUND OF THE INVENTION

1. Field of the Invention

The present invention relates to an assembly packaging method for a sensor element and, more particularly, to the improvement of a method of mounting electrodes to a sensor chip and coating the sensor chip for insulation to complete a sensor element.

2. Description of the Prior Art

As a sensor for detecting the intensity of a magnetic field, hole elements and magnetoresistive elements have been developed and used for a sensing detector in the field of robotics science or the like.

FIGS. 5A to 5C schematically show the conventional process for producing a magnetoresistive sensor.

A compound semiconductor thin layer is first formed on a base plate and subjected to a precision working such as photoetching to produce a sensor chip 1 provided with a predetermined sensing function as shown in FIG. 5A. Thereafter, lead frames 2 for connecting the sensor chip 1 to external elements are mounted on the sensor chip 1 (FIG. 5B) and the sensor chip 1 is coated with a protective insulating layer 3 (FIG. 5C) so as to complete a magnetoresistive sensor element.

By this process, a sensor 4 provided with the lead frames 2 mounted and the protective insulation coating 3 is secured to a predetermined data processing circuit board or print circuit device 5 or base in accordance with a given purpose of use, as shown in FIG. 6.

A conventional sensor having such a structure, however, is defective in that the mechanical strength at the connecting portion of a lead frame is so weak for using hard metal lead frame wires that the lead frame is apt to be easily broken. In addition, in the sensor chip with the lead frames mounted thereon, since the hard metal lead frames project sideways from the edge portions of the sensor chip, as shown in FIG. 5(C), it is impossible to obtain the standardized arrangement of pins to be connected to connectors, so that the handling of the assembly packaged chip cannot be automized and, hence, inconveniently requires manual operation.

Furthermore, in the conventional method, a protective insulation layer must be formed on the sensor chip after the lead frames are mounted thereon one by one. This assembly process must be repeated for each chip, which is the main factor of deterring the mass production and the reduction in cost of sensor chips.

In a conventional magnetoresistive element, for example, an insulation layer for insulating the sensor chip is formed on the chip surface by coating from the outside. Actually, however, the uniform coating cannot be realized for the insulation and, as a result, when the magnetoresistive element is used as a precise position detection sensor, the uneven surface of the insulation layer makes the magnetoresistive characteristic of the sensor unstable.

SUMMARY OF THE INVENTION

Accordingly, it is an object of the present invention to eliminate the above-described problems in the prior art and to provide an assembly packaging method for a sensor element which is capable of facilitating the handling of the sensor and improving the step of providing connecting terminals for connecting the sensor to external elements and the step of forming a protective insulation film so as to realize mass production and reduction in cost.

According to a method of producing a sensor in accordance with the present invention, since it is possible to replace an insulation layer for protecting the surface of the sensor by the insulation tape carrier itself having a very uniform thickness, it is possible to maintain a constant space between the sensor and a magnet or the like which is in close contact with the sensor through the insulation layer, thereby greatly improving the detectivity of the sensor.

To achieve this aim, the present invention provides a method of assembly packaging a sensor by connecting electrodes to the sensor chip having a plurality of terminals, protecting the sensor chip with a protective insulation film and mounting the thus-obtained sensor on a base, the method comprising the steps of: continuously providing electrode patterns which correspond to the respective terminals of sensor chips on a single side of a sheet-like tape carrier composed of an insulating flexible material; bonding the sensor chips to the tape carrier; connecting the terminals of each of the sensor chips to the corresponding electrodes on the tape carrier; separating the portions of the tape carrier with the sensor chips mounted thereon from each other; and mounting the thus-obtained sensor on a base.

In the present invention, it is possible to facilitate the production of a sensor having electrode patterns opposed to a sensor chip with the tape carrier therebetween by providing through holes on the tape carrier in advance at the positions corresponding to the terminals of the tape carrier.

According to the method of the present invention having the above-described structure, the operation of bonding electrodes to the sensor chip and the operation of forming a protective insulation film on the surface of the sensor chip are simultaneously executed by mounting the sensor chip on a tape carrier composed of a protective insulating flexible material on which the electrodes which function as lead frames are provided in advance.

Electrode patterns which function as lead frames are first provided on a sheet-like tape carrier in correspondence with the connecting terminals of a sensor chip. The patterns are continuously provided for the respective sensor chips in the longitudinal direction of the tape carrier.

When the sensor chips are mounted on the tape carrier, in the present invention, the electrode patterns and the sensor chips may be disposed either on the same side or the opposite sides of the tape carrier.

If the electrode patterns are on the opposite side of the tape carrier relative to the sensor chips, small through holes are formed in the tape carrier at the positions corresponding to the terminals of the sensor chips at the time of providing the electrode patterns on the tape carrier. Thereafter the sensor chips are mounted on the tape carrier such that the connecting terminals for connecting the sensor chips to external elements pass the small through holes.

In this way, the sensor chips and the electrode patterns are directly connected with each other or the connecting terminals of the sensor chips are connected to the electrode patterns provided at the respective small through holes with predetermined bonding wires, thereby completing a general assembly process of sensors.

The sensors arranged on the tape carrier in alignment in parallel are separated from each other, and they are mounted on respective bases and packaged, thereby completing the whole producing process.

According to the present invention, since the electrodes are provided in advance on the tape carrier which itself serves to protect and insulate the sensor chips, the step of mounting the sensor chips on the tape carrier is equivalent to both the step of bonding the lead frames and the step of forming the protective insulation coating in the conventional method. The troublesome steps of bonding the respective lead frames to the sensor chip and thereafter coating the sensor chip for protective insulation in the prior art is therefore simplified into one step, because the tape carrier itself constitutes the protective insulation layer. After mounting the sensor chips on the tape carrier, the assembly process is substantially finished merely by connecting the electrode patterns on the tape carrier to the connecting terminals of the sensor chips for connecting the sensor chips to external elements.

Since the electrode pattern functioning as a conventional lead frame is produced on the tape carrier by printing, the electrode pattern itself is provided with flexibility and pliability. Thus, the handling and packaging of the completed sensor is greatly facilitated in comparison with a conventional sensor in which the hard lead frames project from the surfaces of the sensor chip.

In addition, according to the present invention, since the insulation of the sensor chip is provided by the insulation layer of the tape carrier itself, it is possible to make the thickness of the insulation layer of the sensor chip very uniform, thereby enabling the function of the sensor to be made uniform irrespective of the position on the sensor surface.

The above and other objects, features and advantages of the present invention will become clear from the following description of the preferred embodiments thereof, taken in conjunction with the accompanying drawings.

BRIEF DESCRIPTION OF THE DRAWINGS

FIG. 1 shows the structure of a tape carrier with small through holes and electrode patterns formed thereon in an embodiment of a method of assembly packaging a sensor according to the present invention;

FIG. 2 shows the structure of the tape carrier with sensor chips mounted thereon, wherein FIG. 2A is a sectional view and FIG. 2B is a plan view thereof;

FIG. 5 is an explanatory view of a process of assembling a sensor chip in the prior art; and FIG. 6 shows the external perspective view of a conventional sensor chip incorporated into a device.

DESCRIPTION OF THE PREFERRED EMBODIMENTS

Figure 3:
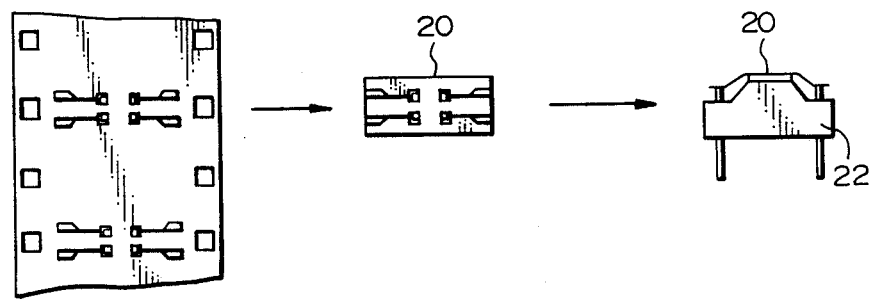
FIG. 3 is an explanatory view of a producing process in accordance with the present invention.

Preferred embodiments of the present invention will be explained with reference to the accompanying drawings.

The feature of the present invention lies in the structure for swiftly executing the step of mounting lead frames on a sensor chip and the step of forming a protective insulation film, which are executed in different steps in the prior art, by a continuous operation and in the utilization of flexible lead frames which facilitates the operation of mounting the sensor on a base and other handlings.

FIG. 1 shows a basic unit of a tape carrier 14 with small through holes 10 and electrode patterns 12 provided thereon in correspondence with the connecting terminals for connecting the sensor chip to external elements.

A sheet-like tape carrier 14 of polyester or polyimide is continuously fed, and unit patterns of small through holes 10 and electrodes 12 are formed in series at predetermined positions.

In this embodiment, since the sensor chip is disposed on the opposite side of the tape carrier 14 relative to the electrodes 12, as will be described later, it is necessary to provide the small through holes 10 to connect the terminals of the sensor chip and the electrodes 12, but in the case of disposing the electrodes 12 and the sensor chip on the same side of the tape carrier 14, the small through holes 10 are unnecessary.

The small through holes 10 and the electrode 12 are provided in correspondence with the connecting terminals of the sensor chip for connecting the sensor chip to external elements. If the electrodes 12 are provided on the top surface of the tape carrier 14 shown in FIG. 1, the sensor chip is mounted on the back surface thereof at the position indicated by the broken line.

It will be understood that since the electrodes 12 are provided on the tape carrier 14 by coating which utilizes a printing technique, they are imparted with a flexibility which enables the electrodes 12 to be bent with the tape carrier 14 to a certain extent.

FIG. 1(A) shows the structure for wire bonding the connecting terminals of the sensor chip to the electrodes. The electrodes 12 are located at the positions with a predetermined distance from the small through holes 10.

FIG. 1(B) shows the structure for connecting the electrodes directly to the terminals of the sensor chip without using a wire. An electrode 12a is so extended as to be tapered toward the small through hole 10 and the tip of the electrode 12a enters the small through hole 10.

The small through holes 10 are produced by being punched into the tape carrier 14 from the opposite side of the tape carrier 14 relative to the electrodes 12 by the amount equivalent to the thickness of the tape carrier 14 so as to leave the tips of the electrodes 12 in the small through holes 10.

Either of the wire bonding type electrode pattern (FIG. 1(A)) and the lead frame bonding type electrode pattern (FIG. 1(B)) may be selected as desired.

The present invention is characterized in that the different steps of soldering lead frames to the respective terminals of a sensor chip and thereafter forming a protective insulation film on the surface of the sensor chip, which are inefficient and make the sensor chip difficult to handle in a conventional sensor chip assembly technique, are replaced by a series of operations utilizing a sheet-like tape carrier together with an electrode printing technique.

In the process shown in FIG. 1, since the tape carrier 14 is composed of a protective insulating material, the patterns of the electrodes 12 which substitute for the lead frames of a metal solid provided as separate members in the prior art are printed on the tape carrier 14. In this way, the lead frames and the protective insulation film, which are members completely separated from each other in the prior art, are integrated into the tape carrier with print circuit.

In this state, a sensor chip 16 is solidly attached to the position indicated by the broken line from the back surface of the tape carrier 14, as shown in FIG. 2B. As an adhesive, a thermosetting or ultraviolet-curing resin having a sufficient elasticity for relaxing or absorbing the stress between the tape carrier 14 and the sensor chip 16 due to thermal expansion would be preferably utilized.

After the sensor chip 16 is mounted on the tape carrier 14 in this way, the connecting terminal portions 16a of the sensor chip 16 which are seen through the small through hole 10 on the top surface side of the tape carrier 14 with the electrodes 12 provided thereon are connected to the electrodes 12 by lead wires 18. It can be understood that in the case of a direct connecting type electrode pattern shown in FIG. 1(B), the tip of the electrode 12a is directly bonded to the terminal portion 16a of the sensor chip 16 by soldering or the like.

In both cases, at the point of time when the sensor chip 16 is secured to the tape carrier 14 by adhesion or the like and the terminal portions 16a are successively connected to the electrode patterns 12, the surface of the sensor chip 16 which has been exposed is insulated and protectively covered by the uniform insulation layer of the tape carrier 14. Since the thickness of the insulation film is the very uniform thickness of the tape carrier 14 itself, the characteristics of the sensor chip 14 become very stable over the entire surface.

In this way, a general sensor assembly packaging process is finished and a plurality of sensors 20 having the above-described structure are provided in alignment on the sheet-like tape carrier 14.

The tape carrier 14 is then cut at each unit of the sensors 20, for example, by removing the protective insulating material between the electrodes in the adjacent sensors 20 or between the adjacent sensors 20 by blanking or the like, as shown in FIG. 3. The separated sensor 20 is mounted on a sensor base or an external detecting device.

According to this embodiment of an assembly packaging method, the electrodes corresponding to the lead frames which must be connected to the sensor chip one by one in the prior art are provided on the tape carrier in the form of patterns. In addition, since the tape carrier itself is composed of a protective insulating material, it is possible to execute at one step both the operation of connecting the lead frames and the operation of forming the protective insulation film, which must be carried out at completely different steps in the prior art.

Since the electrodes are provided on the tape carrier in the form of patterns by printing or the like, they have substantially equal pliability and flexibility to that of the tape carrier which serves to insulate and protect the sensor chip. The handling of the sensor is therefore greatly facilitated in comparison with a conventional sensor in which the hard lead frames project sideways from the edge portions of the sensor chip. Thus, the method of the present invention greatly contributes to the full automatization of assembly packaging.

Figure 4:
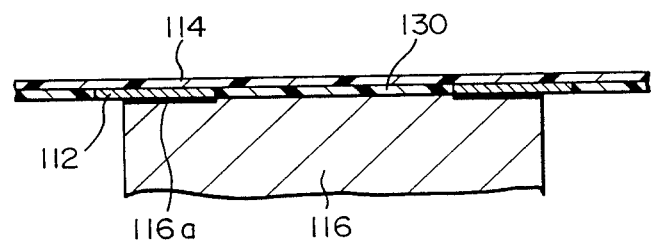
FIG. 4 is a sectional view of the main part of a sensor chip obtained by another embodiment of a method of assembly packaging a sensor according to the present invention.

FIG. 4 shows another embodiment of the present invention. This embodiment is characterized in that a sensor chip 116 is disposed on the same side of the tape carrier 114 relative to electrode patterns 112.

The terminal portions 116a of the sensor chip 116 are connected directly to the electrode patterns 112 by soldering or the like, and a slight gap formed between the sensor chip 116 and the tape carrier 114 is filled up by applying a silicon adhesive 130 or the like to a small thickness.

This embodiment also enables the step of electrical connection between the terminals and the step of bonding the sensor chip 116 to the tape carrier 114 to be easily completed simultaneously.

It is to be understood that the exposed surface of the sensor chip 116 and the outer surface of the insulation layer have very uniform thicknesses determined by the thicknesses of the tape carrier 114 and the electrode pattern 112.

Accordingly, this embodiment also enables a sensor chip having excellent detective sensitivity to be produced at a low cost.

As described above, according to the present invention, since a technique of continuously mounting sensor chips on a tape carrier composed of a protective insulating material with electrode patterns provided thereon and then separating the thus-obtained chips from each other is adopted, thereby the assembly packaging process is shortened and an efficient process is realized. Various other advantages are produced by the present invention such as the improvement of the configuration of the sensor chip for a better handling property, speed-up of the producing process, reduction in cost and automatization suitable for mass production.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A method of assembly packaging a sensor element by connecting electrodes to a sensor chip having a plurality of terminals, coating said sensor chip with a protective insulation film and mounting the thus-obtained sensor on a sensor base, said method comprising the steps of:

continuously providing electrode patterns which correspond to the respective terminals of sensor chips on a single side of a sheet-like tape carrier composed of an insulating material;

bonding said sensor chips to said tape carrier to provide a bonded insulation film on said chips;

connecting said terminals of each of said sensor chips to the corresponding electrode patterns on said tape carrier;

separating portions of said tape carrier with said sensor chips mounted thereon from the tape carrier;

and mounting the thus-obtained sensor on said sensor base.

2. A method according to claim 1, wherein a plurality of small through holes are formed in said tape carrier in correspondence with the respective terminals of said sensor chips;

said sensor chips are fixed on the opposite side of said tape carrier relative to said electrode patterns; and said electrode patterns and said terminals of said sensor chips are electrically connected through said small through holes.

3. A method according to claim 1, wherein said sensor chips are bonded to said tape carrier on the same side with said electrode patterns.

4. A method according to claim 1, wherein said terminals of each of said sensor chips are connected to the corresponding electrodes patterns on said tape carrier by a wire bonding step for connecting said terminals of said sensor to the corresponding electrodes patterns through wires.

5. A method according to claim 1, wherein said terminals of each of said sensor chips are connected to the corresponding electrode patterns on said tape carrier by a lead frame bonding step for connecting said terminals of said sensor directly to the corresponding electrode patterns on said tape carrier.

6. A method according to claim 1, further comprising the step of adhering said sensor chips and said tape carrier by a thermosetting or ultraviolet-curing resin adhesive having a sufficient elasticity for relaxing or absorbing the stress between said tape carrier and said sensor chips due to thermal expansion.

* * * * *